(12) United States Patent
Piorun et al.

(10) Patent No.: US 7,126,798 B2
(45) Date of Patent: Oct. 24, 2006

(54) ON DIE VOLTAGE REGULATOR

(75) Inventors: Michael D. Piorun, Citrus Heights, CA (US); Andrew Volk, Granite Bay, CA (US); Chinnugounder Senthilkumar, Folsom, CA (US); Robert Fulton, Rancho Cordova, CA (US); David D. Donofrio, Folsom, CA (US); Steve S. Simoni, Roseville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/889,515

(22) Filed: Jul. 12, 2004

(65) Prior Publication Data

US 2004/0240309 A1    Dec. 2, 2004

Related U.S. Application Data

(62) Division of application No. 10/334,505, filed on Dec. 31, 2002, now Pat. No. 6,940,163.

(51) Int. Cl.
*H02H 3/22* (2006.01)

(52) U.S. Cl. .......................... 361/18; 361/111

(58) Field of Classification Search ................. 361/18, 361/56, 91.1, 111, 110; 323/266, 267, 274, 323/268; 713/300
See application file for complete search history.

(56) References Cited

U.S. PATENT DOCUMENTS

| | | | |
|---|---|---|---|
| 4,165,642 A | 8/1979 | Lipp | |
| 5,444,298 A | 8/1995 | Schutz | |
| 5,793,247 A * | 8/1998 | McClure | 327/538 |
| 5,847,951 A * | 12/1998 | Brown et al. | 363/147 |
| 6,094,367 A * | 7/2000 | Hsu et al. | 363/78 |
| 6,297,664 B1 * | 10/2001 | Galli | 326/30 |
| 6,396,137 B1 | 5/2002 | Klughart | |
| 6,594,556 B1 * | 7/2003 | Agatstein et al. | 700/298 |
| 6,686,796 B1 * | 2/2004 | Casper | 327/538 |
| 6,710,583 B1 * | 3/2004 | Stanescu et al. | 323/280 |
| 6,750,700 B1 | 6/2004 | Keeth et al. | |
| 6,756,839 B1 * | 6/2004 | Hall et al. | 327/538 |
| 6,775,112 B1 * | 8/2004 | Smith et al. | 361/18 |
| 6,823,465 B1 * | 11/2004 | Zhang | 713/300 |
| 2004/0125558 A1 * | 7/2004 | DiStafano | 361/687 |
| 2004/0145362 A1 * | 7/2004 | Lin et al. | 323/316 |
| 2004/0158449 A1 * | 8/2004 | Koertzen | 703/18 |

* cited by examiner

*Primary Examiner*—Brian Sircus
*Assistant Examiner*—Danny Nguyen
(74) *Attorney, Agent, or Firm*—Blakely, Sokoloff, Taylor & Zafman LLP

(57) ABSTRACT

According to one embodiment, an integrated circuit (IC) is disclosed. The IC includes a package, a die mounted within the package, circuit components mounted on the die, and a voltage regulator mounted on the die to supply power to the circuit components.

16 Claims, 4 Drawing Sheets

ON DIE VOLTAGE REGULATOR

The present patent application is a Divisional of application Ser. No. 10/334,505, filed Dec. 31, 2002 now U.S. Pat. No. 6,940,163.

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

The present invention relates to computer systems; more particularly, the present invention relates to delivering power to a power sensitive system such as a computer system.

BACKGROUND

Integrated circuit components are typically powered by voltage regulators located at a remote location. Particularly, the voltage regulator is mounted on a computer system motherboard. Having the voltage regulator at a remote location requires the power signal to travel to the die by means of a motherboard trace and a bond-wire on the package, which are both highly inductive. The inductance typically blocks high frequencies.

Often, the integrated circuit includes components that operate at various frequencies (e.g., the 400–500 MHz switching range). Consequently, a voltage drop exists across the inductive path because of the load switching current. The voltage drop is represented by the formula $V=L*(di/dt)$. This voltage drop restricts the voltage regulation. One way to overcome this is to include de-coupling capacitors. The de-coupling capacitors compensate for the inductance by storing and immediately supplying energy. De-coupling capacitors on the motherboard can help compensate for board inductance. De-coupling capacitors can be placed on the integrated circuit die to help compensate for package and die inductance. However, capacitors increase the die area of the integrated circuit. Moreover, the leakage current draw of the capacitors may affect low process applications.

BRIEF DESCRIPTION OF THE DRAWINGS

The invention is illustrated by way of example and not limitation in the figures of the accompanying drawings, in which like references indicate similar elements, and in which.

DETAILED DESCRIPTION

A voltage regulator integrated in an integrated circuit is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
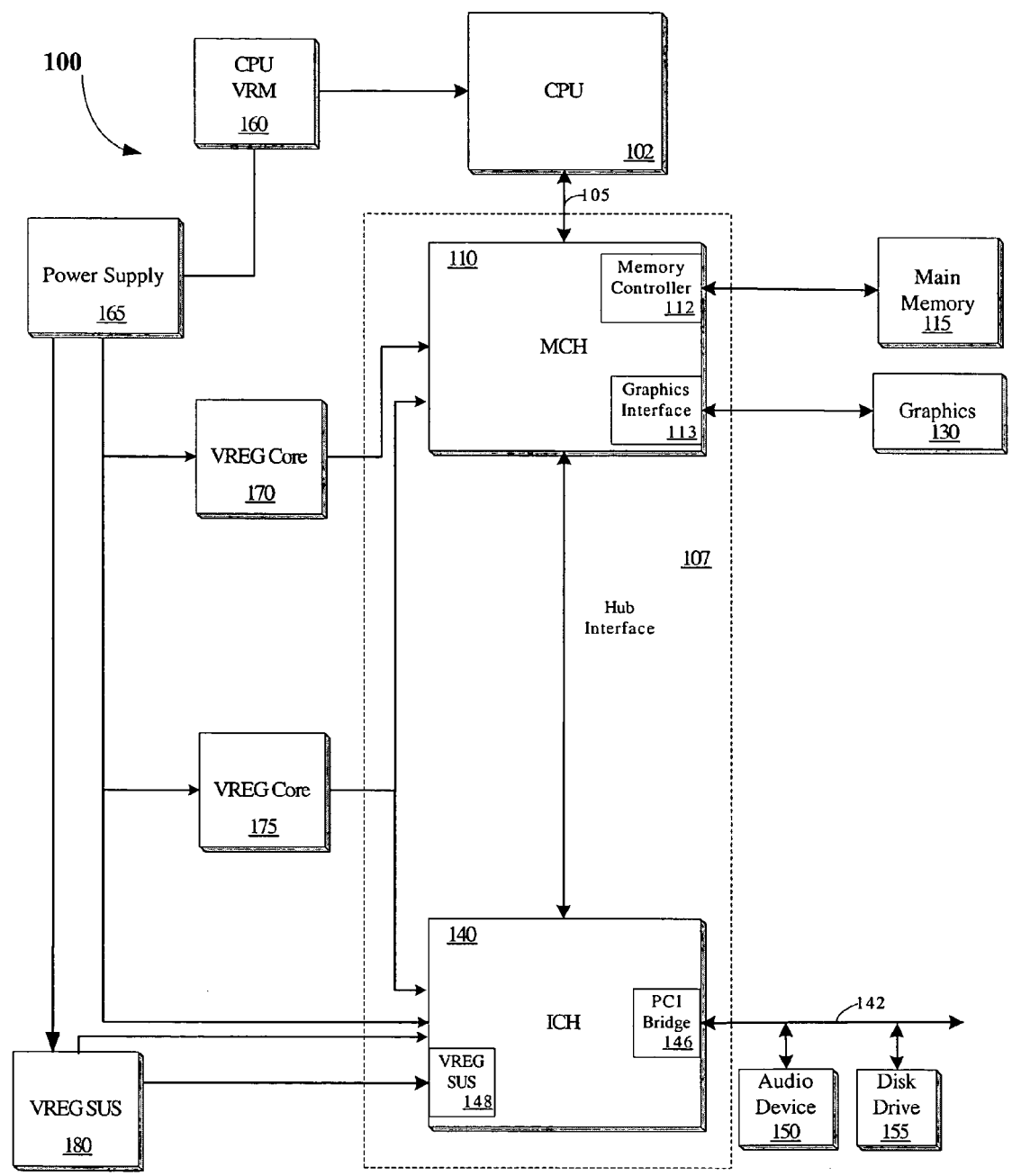
FIG. 1 is a block diagram of one embodiment of a computer system.

FIG. 1 is a block diagram of one embodiment of a computer system 100. Computer system 100 includes a central processing unit (CPU) 102 coupled to bus 105. In one embodiment, CPU 102 is a processor in the Pentium® family of processors including the Pentium® II processor family, Pentium® III processors, and Pentium® IV processors available from Intel Corporation of Santa Clara, Calif. Alternatively, other CPUs may be used.

A chipset 107 is also coupled to bus 105. Chipset 107 includes a memory control hub (MCH) 110. MCH 110 may include a memory controller 112 that is coupled to a main system memory 115. Main system memory 115 stores data and sequences of instructions that are executed by CPU 102 or any other device included in system 100. In one embodiment, main system memory 115 includes dynamic random access memory (DRAM); however, main system memory 115 may be implemented using other memory types. Additional devices may also be coupled to bus 105, such as multiple CPUs and/or multiple system memories.

MCH 110 may also include a graphics interface 113 coupled to a graphics accelerator 130. In one embodiment, graphics interface 113 is coupled to graphics accelerator 130 via an accelerated graphics port (AGP) that operates according to an AGP Specification Revision 2.0 interface developed by Intel Corporation of Santa Clara, Calif.

In addition, the hub interface couples MCH 110 to an input/output control hub (ICH) 140 via a hub interface. ICH 140 provides an interface to input/output (I/O) devices within computer system 100. ICH 140 may be coupled to a Peripheral Component Interconnect bus adhering to a Specification Revision 2.1 bus developed by the PCI Special Interest Group of Portland, Oreg. Thus, ICH 140 includes a PCI bridge 146 that provides an interface to a PCI bus 142. PCI bridge 146 provides a data path between CPU 102 and peripheral devices.

PCI bus 142 includes an audio device 150 and a disk drive 155. However, one of ordinary skill in the art will appreciate that other devices may be coupled to PCI bus 142. In addition, one of ordinary skill in the art will recognize that CPU 102 and MCH 110 could be combined to form a single chip. Further graphics accelerator 130 may be included within MCH 110 in other embodiments.

In addition, computer system 100 includes a power supply 165 and a multitude of voltage regulators that are used to provide power to various components within computer system 100. CPU voltage regulator module (VREG) 160 provides voltage to CPU 102. VREG core 170 supplies memory voltage for MCH 110 and memory 115. VREG core 175 supplies core voltage for ICH 140. In one embodiment, VREG core 170 and 175 each supply a 1.5V supply voltage.

In a further embodiment, voltage regulators 160, 170 and 175 supply voltage during normal (full power) operation and are off during suspend mode operation. Additionally, VREG core 170 may have an alternate mode to supply stand-by power to main memory 115 during certain suspend modes.

VREG SUS 180 differs from the other voltage regulators in FIG. 1 in that it is designed to be powered in all normal and suspend power management modes. In desktop computer systems 100, VREG SUS 180 supplies power whenever the main power supply 165 is getting AC power. In mobile computer systems 100, VREG SUS 180 supplies power when the PC is in normal and suspend power states and is off when the entire PC is completely shut down. In a further embodiment, VREG SUS 180 supplies a 3.3V supply voltage.

According to one embodiment, a VREG suspend module 148 is integrated on the chipset 107 integrated circuit within ICH 140. In a further embodiment, VREG core 175 provides power to ICH 140 during a core power (fully on) mode, while VREG suspend module 148, along with VREG SUS module 180, provides power to ICH 140 during the suspend mode. In yet a further embodiment, VREG suspend module 148 provides a 1.5V scaled down from a 3.3V received from VREG 180.

Figure 2:
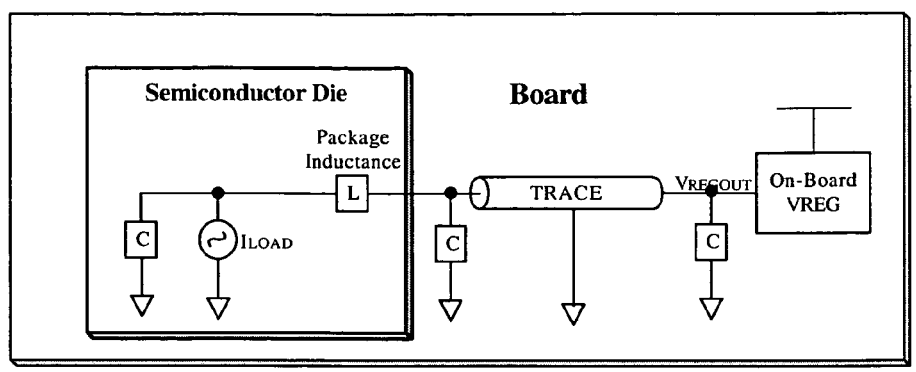
FIG. 2 is a block diagram of an exemplary voltage regulator module.

Having a voltage regulator on an integrated circuit provides various advantages. Traditionally, the suspend mode voltage regulator has been mounted on the computer system 100 motherboard, while feeding power to the integrated circuit. FIG. 2 illustrates an exemplary power supply mounted on a motherboard.

As shown in FIG. 2, the voltage regulator is located at a remote location from the semiconductor in which it supplies (e.g., on the motherboard), while the current load is drawn at the semiconductor die. As discussed above, having the voltage regulator at a remote location results in an inherent inductance composed of the package bond-wire and traces of the motherboard. The inductance blocks high frequency switching.

However, the semiconductor may include circuits operating at the 400–500 MHz switching range. The regulated voltage is lower because of this voltage drop, thus circuits may not function properly.

One solution is to include de-coupling capacitors as shown in FIG. 2. De-coupling capacitors compensate for the inductance by storing and immediately releasing energy. De-coupling capacitors on the motherboard do not compensate for inductance inside the integrated circuit package. De-coupling capacitors placed on the integrated circuit die helps compensate for package inductance but increase the die area of the semiconductor. In addition, the increased current leakage of the on-die capacitors may affect low power applications.

Figure 3:
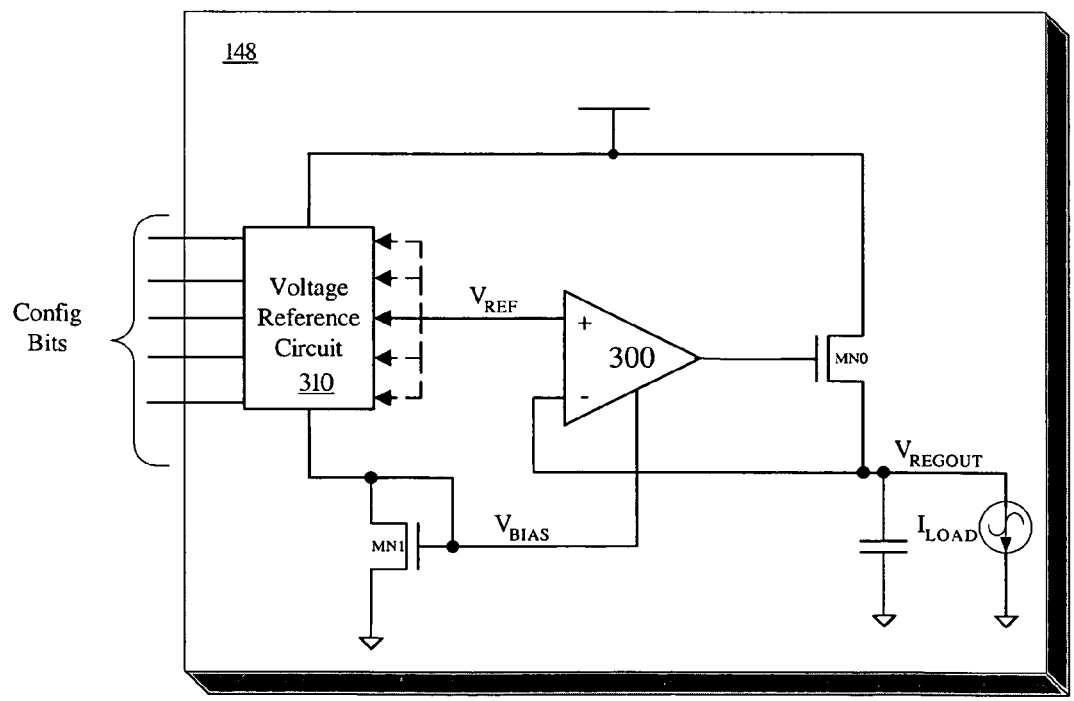
FIG. 3 is a block diagram of one embodiment of a voltage regulator module on an integrated circuit.

Therefore, a voltage regulator mounted on an integrated circuit is disclosed. FIG. 3 is a block diagram of one embodiment of VREG suspend module 148 mounted within ICH 140. VREG suspend module 148 is an on-die voltage regulator that includes operational amplifier 300, a voltage reference circuit 310 and transistors MN0 and MN1.

Voltage reference circuit 310 generates a reference voltage ($V_{REF}$) off of the suspend 3.3 volt supply received from VREG SUS 180. According to one embodiment, voltage reference circuit 310 is implemented using a resistor divider to generate a 1.5V $V_{REF}$. However, in other embodiments other types of accurate voltage reference circuit (such as a bandgap voltage reference generator) may be used.

In one embodiment, $V_{REF}$ may be adjusted after manufacturing the die (post-silicon) by changing the tap point of voltage reference circuit 310. In a further embodiment, the adjustment is made in software upon receiving configuration bits from a Basic Input Output System (BIOS) during startup of computer system 100. In another embodiment, the adjustment is made by a metal change.

According to a further embodiment, a current mirror for operational amplifier 300 is also included in the voltage reference circuit 310 stack in order to stabilize the current through transistor MN1. The voltage developed across MN1 is used to mirror a proportional bias current in amplifier 300. Slight variations in the voltage threshold will affect $V_{REF}$, but in a direction that is complementary to the supply needs of the process corner.

Operational amplifier 300 combined with the pass transistor MN0 is the main portion of the voltage regulator. In one embodiment the transistor MN0 is implemented using NMOS transistor. However, a PMOS pass transistor design is also possible. $V_{REF}$ determines the DC output voltage, $V_{REGOUT}$, coupled to a current load. When a current increase occurs, $V_{REGOUT}$ is pulled lower, below $V_{REF}$. Operational amplifier 300 compensates by driving a larger gate voltage on MN0, if the current increase is within the bandwidth of the regulator. Otherwise, the decoupling capacitors respond first to the current spike, which use their stored energy to help hold up the output voltage $V_{REGOUT}$. The larger gate voltage recovers the output voltage $V_{REGOUT}$, which is a closed loop system.

According to one embodiment, VREG suspend module 148 provides the output voltage $V_{REGOUT}$ to an output pad at ICH 140. The signal received at the output pad may be used as a backup so that an VREG suspend module 148 can drive the same signal. Alternatively, the output signal may be used for debugging purposes.

VREG module 148 has a much higher loop bandwidth (e.g., on the order of 1–2 MHz), whereas a voltage regulator on the motherboard typically has a loop bandwidth on the order of 15 kHz. Also, since the VREG module 148 is microns away from the load it is powering, instead of inches on the board, the delay between the regulator and the load is much less, which leads to a faster response time. Also, with an on-die voltage regulator, the package inductance is eliminated which again helps the frequency response. As a result, this regulates high frequency circuits much better than an on-board voltage regulator.

Figure 4:
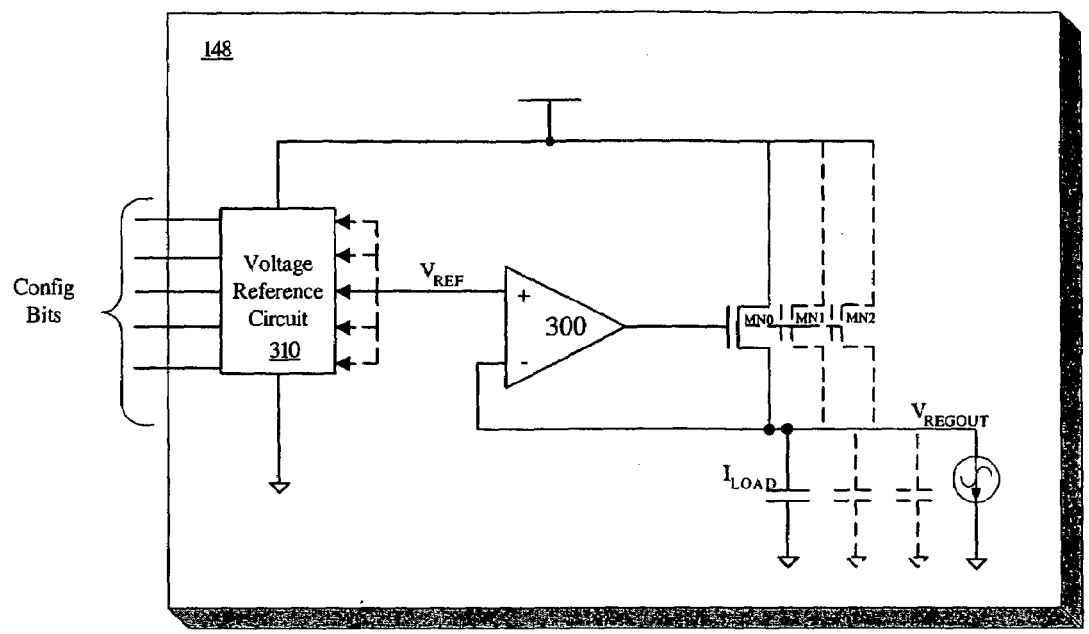
FIG. 4 is a block diagram of another embodiment of a voltage regulator module on an integrated circuit.

FIG. 4 is a block diagram of another embodiment of a VREG suspend module 148. This embodiment of VREG module 148 operates similar to the VREG module 148 described above with respect to FIG. 3. However, in this embodiment, the pass transistor MN0 is divided into constituent pieces.

In one embodiment, VREG suspend module 148 includes post-silicon options for the pass transistor size MN0 to (MN0+MN1) and (MN0+MN1+MN2). One of ordinary skill in the art will appreciate that three options exist in the diagram, but there could be any number of post-silicon options. For instance, if the current is lower than expected in silicon, the pass transistor size may be adjusted to handle the lower current. Other reasons to adjust the pass transistor size include op-amp loading and response time. The additional transistors may also be used for other purposes (e.g., extra $V_{REGOUT}$ decoupling capacitance).

Further, this embodiment of suspend module 148 provides for additional on-die decoupling capacitance. The amount of on-die decoupling and/or compensation capacitance may be adjusted further in post-silicon to target the suspend module 148 bandwidth at the load operating frequency. In one embodiment, $V_{REF}$ may be adjusted in by changing the tap point of the resistor stack.

Further, this embodiment of suspend module 148 provides for post-silicon options for op-amp input/output compensation resistance and/or capacitance (not shown). RC filters could be used to repress noise on the reference signal and/or the op-amp output signal to further tune the voltage variation tolerance and/or the bandwidth of the voltage regulator.

As described above with respect to voltage reference circuit 310, the post-silicon adjustments may be made in software upon receiving configuration bits from BIOS during startup of computer system 100. In another embodiment, there is a customer setting that automatically selects the best option based on silicon performance.

Figure 5:
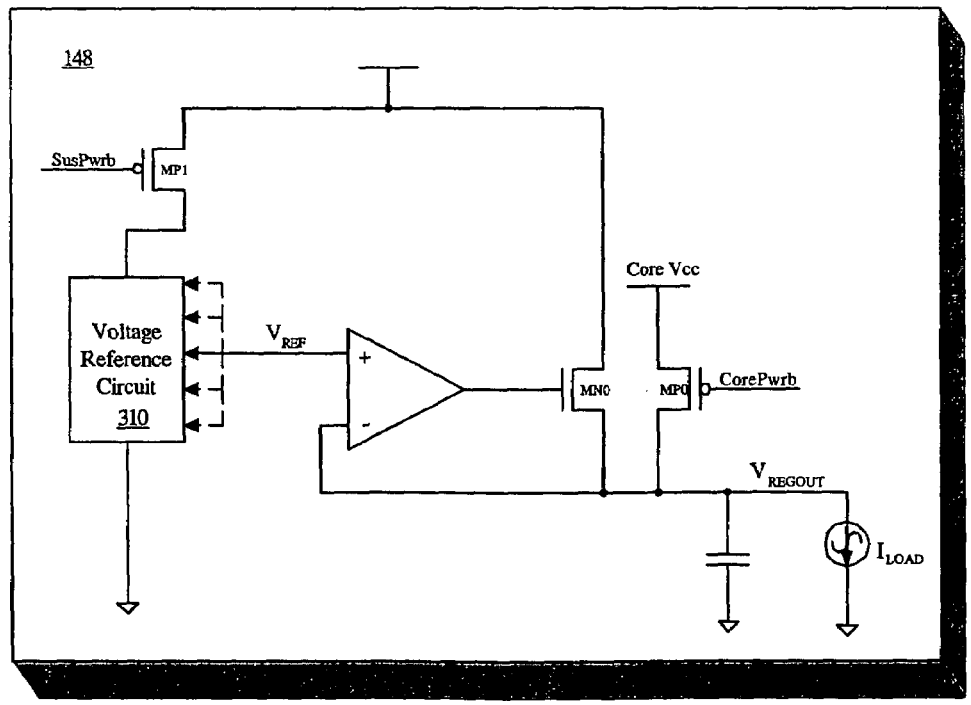
FIG. 5 is a block diagram of yet another embodiment of a voltage regulator module on an integrated circuit.

The embodiment of VREG suspend module 148 illustrated in FIG. 4 regulates from the VREG SUS module 180 at all times. However, this causes additional power dissipation in the integrated circuit package since active mode currents are much greater than suspend mode currents. The load currents flow through the pass transistor MN0, which has a large voltage drop (e.g., the voltage difference between VREG suspend module 180 and VREG suspend module 148). The combination of these leads to the additional power dissipation on-die. FIG. 5 illustrates an enhanced version of the on-die voltage regulator that corrects the additional power dissipation problem.

Referring to FIG. 5, VREG suspend module 148 includes PMOS transistors MP0 and MP1, in addition to pass transistor MN0. According to one embodiment, when VREG suspend module 148 is in an active mode, the gate of transistor MP0 is activated by a CorePwrb signal. As a result, the Core Vcc power supply is on and the suspend power is tapped from the core supply through transistor MP0. The power dissipation is reduced significantly because the active-mode current no longer flows through the voltage drop between VREG suspend module 180 and VREG suspend module 148.

When VREG suspend module 148 is in the suspend mode, the gate of transistor MP0 is deactivated, and the gate of transistor MP1 is activated by a SusPwrb signal. Accordingly, suspend module 148 operates as described in FIG. 4 since core Vcc is not present. The power dissipation through MN0 still exists, but it is less significant since suspend-mode currents are much less than active-mode currents. In a further embodiment, control logic (not shown) is provided within computer system 100 to control the SusPwrb and CorePwrb signals in the suspend/active mode transition such that no suspend well voltage droop occurs during power state changes.

Figure 6:
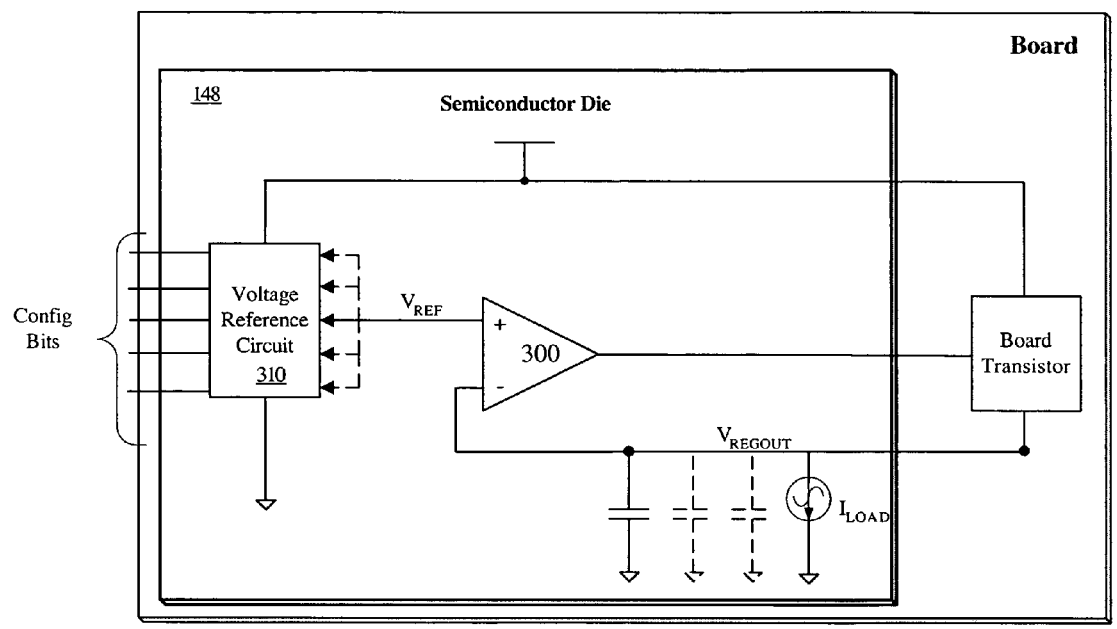
FIG. 6 is a block diagram of yet another embodiment of a voltage regulator module on an integrated circuit, where the pass transistor is moved off-die for power consumption/thermal reasons.

FIG. 6 shows another design of the voltage regulator that reduces the on-die power consumption. In this design, the pass transistor MN0 is moved off-die to reduce the on-die power dissipation (note: any type of transistor may be used, hence the block "Board Transistor"). Recall from the previous description of FIG. 3 and FIG. 4 that a large amount of power is dissipated through the pass transistor MN0. Although the power dissipation remains the same for the entire system, moving some of the power dissipation off-die helps for thermal reasons. An advantage to this over the design presented in FIG. 5 is that a separate supply to tap power from is not required. This is also advantageous because a pass transistor generally costs less than an on-board voltage regulator.

As described above, the on-die voltage regulator reduces motherboard routing congestion by eliminating a voltage regulator a motherboard. Further, having an on-die voltage regulator results in customer savings of board trace routing and part cost of an on-board suspend regulator. In addition, the on-die voltage regulator is microns away from the load instead of inches, eliminating the package inductance which hurts the frequency response. Further, the on-die regulator has a much higher loop bandwidth (e.g., 1–2 MHz instead of 15 kHz).

A further advantage of using an on-die voltage regulator is better PVT (process-voltage-temperature) circuit performance. The output voltage could be tuned, statically or dynamically, based on silicon skew and/or temperature for optimum performance. If the main goal is a higher speed (as in a CPU), the output voltage could be set higher across any silicon skews to achieve a higher frequency. Likewise, if the main goal is power savings (as often in chipsets), the voltage could be artificially set lower across any skew (particularly the fast silicon skew).

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

What is claimed is:

1. A computer system comprising:
    a central processing unit (CPU); and
    a chipset, coupled to the CPU, having a voltage regulator integrated on the die to supply power to chipset circuit components, the voltage regulator comprising:
        an amplifier to provide a regulated output voltage;
        a voltage reference circuit, coupled to the amplifier, to provide an adjustable reference voltage to the amplifier based upon a received configuration signal;
        a first transistor, coupled to the output of the amplifier, to regulate the output voltage;
        a second transistor coupled to the output of the amplifier; and
        a third transistor coupled to the output of the amplifier, wherein one or more of the first, second and third transistors are activated based upon the output current flow from the amplifier.

2. The computer system of claim 1 wherein the voltage reference circuit is a bandgap.

3. The computer system of claim 1 wherein the voltage reference circuit is a resistor divider.

4. The computer system of claim 1 wherein the configuration signal is received from a basic input/output system (BIOS).

5. The computer system of claim 1 wherein the voltage regulator further comprises a current mirror coupled to the voltage reference circuit and the amplifier.

6. The computer system of claim 1 wherein the first transistor is mounted on a motherboard outside of the chipset.

7. The computer system of claim 1 wherein the first, second and third transistors are activated by receiving a configuration signal from a basic input/output system (BIOS).

8. A computer system comprising:
    a central processing unit (CPU); and
    a chipset, coupled to the CPU, having a voltage regulator integrated on the die to supply power to chipset circuit components, the voltage regulator comprising;
        an amplifier to provide a regulated output voltage;

a voltage reference circuit, coupled to the amplifier, to provide an adjustable reference voltage to the amplifier based upon a received configuration signal;
a first capacitor coupled to the amplifier;
a second capacitor coupled to the amplifier; and
a third capacitor coupled to the amplifier, wherein one or more of the first, second and third capacitors are provided based upon the operating frequency of the voltage regulator.

9. The computer system of claim 8 wherein the first, second and third capacitors are provided by receiving a configuration signal from a basic system input/output system (BIOS).

10. A computer system comprising:
a central processing unit (CPU);
a memory control hub (MCH); and
an input/output control hub (ICH), coupled to the MCH, having a voltage regulator integrated on the die to supply power to ICH circuit components, the voltage regulator comprising:
an amplifier to provide a regulated output voltage; and
a voltage reference circuit, coupled to the amplifier, to provide an adjustable reference voltage to the amplifier based upon a received configuration signal.

11. The computer system of claim 10 wherein the voltage regulator further comprises a current mirror coupled to the voltage reference circuit and the amplifier.

12. The computer system of claim 10 wherein the voltage regulator further comprises a first transistor, coupled to the output of the amplifier, to regulate the output voltage.

13. The computer system of claim 12 wherein the first transistor is mounted on a motherboard outside of the ICH.

14. The computer system of claim 12 wherein the voltage regulator further comprises:
a second transistor coupled to the output of the amplifier; and
a third transistor coupled to the output of the amplifier, wherein one or more of the first, second and third transistors are activated based upon the output current flow from the amplifier.

15. The computer system of claim 12 wherein the voltage regulator further comprises:
a first capacitor coupled to the amplifier;
a second capacitor coupled to the amplifier; and
a third transistor capacitor coupled to the amplifier, wherein one or more of the first, second and third capacitors are provided based upon the operating frequency of the voltage regulator.

16. The computer system of claim 10 further comprising a first voltage regulator (VREG) core coupled to the MCH;
a second VREG core coupled to the ICH; and
a VREG suspend module coupled to the voltage regulator.

* * * * *